US012021498B2

(12) United States Patent
Hou et al.

(10) Patent No.: US 12,021,498 B2
(45) Date of Patent: Jun. 25, 2024

(54) BULK ACOUSTIC WAVE RESONATOR WITH MULTILAYER BASE

(71) Applicant: Global Communication Semiconductors, LLC, Torrance, CA (US)

(72) Inventors: Liping D. Hou, Torrance, CA (US); Alexander M. Vigo, Long Beach, CA (US); Shing-Kuo Wang, Torrance, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 672 days.

(21) Appl. No.: 17/071,810

(22) Filed: Oct. 15, 2020

(65) Prior Publication Data
US 2021/0111699 A1    Apr. 15, 2021

Related U.S. Application Data

(60) Provisional application No. 62/915,577, filed on Oct. 15, 2019, provisional application No. 62/915,588, (Continued)

(51) Int. Cl.
*H03H 9/02* (2006.01)
*H03H 9/13* (2006.01)
(Continued)

(52) U.S. Cl.
CPC .... *H03H 9/02015* (2013.01); *H03H 9/02102* (2013.01); *H03H 9/0211* (2013.01);
(Continued)

(58) Field of Classification Search
CPC ........... H03H 9/02015; H03H 9/02102; H03H 9/0211; H03H 9/02118; H03H 9/131;
(Continued)

(56) References Cited

U.S. PATENT DOCUMENTS 4,320,365 A    3/1982 Black et al.
4,456,850 A    6/1984 Inoue et al.
(Continued)

FOREIGN PATENT DOCUMENTS

JP    2016140053 A    8/2016
TW    200610266 A    3/2006
WO    WO2020132997 A1    7/2020

OTHER PUBLICATIONS

Global Communication Semiconductors, Inc., Restriction Election, U.S. Appl. No. 16/455,627, filed Aug. 19, 2022, 7 pgs.
(Continued)

*Primary Examiner* — Andrea Lindgren Baltzell
*Assistant Examiner* — Kimberly E Glenn
(74) *Attorney, Agent, or Firm* — Morgan, Lewis & Bockius LLP

(57) ABSTRACT

A bulk acoustic (BAW) resonator having a multilayer base and method of fabricating the bulk acoustic resonator is disclosed. A BAW resonator comprises a substrate having a cavity and including a frame around the cavity, a multilayer base adjacent the cavity and supported by the frame. The multilayer base includes a first layer of crystalline material having a first lattice constant and a second layer of crystalline material having a second lattice constant that is distinct from the first lattice constant. The BAW resonator further includes a stack over the multilayer base. The stack includes a first electrode formed on the multilayer base, a piezoelectric layer having a first side coupled to the first electrode and a second side opposite to the first side of the piezoelectric layer, and a second electrode coupled to the second side of the piezoelectric layer.

13 Claims, 13 Drawing Sheets

Related U.S. Application Data filed on Oct. 15, 2019, provisional application No. 62/915,581, filed on Oct. 15, 2019, provisional application No. 62/915,573, filed on Oct. 15, 2019.

(51) Int. Cl.
*H03H 9/17* (2006.01)
*H10N 30/00* (2023.01)
*H10N 30/85* (2023.01)

(52) U.S. Cl.
CPC ........ *H03H 9/02118* (2013.01); *H03H 9/131* (2013.01); *H03H 9/17* (2013.01); *H03H 9/173* (2013.01); *H10N 30/1051* (2023.02); *H10N 30/85* (2023.02)

(58) Field of Classification Search
CPC .... H03H 9/17; H03H 9/173; H03H 2003/021; H03H 3/02; H10N 30/1051; H10N 30/85; H10N 30/50; H10N 30/853
See application file for complete search history.

(56) References Cited

U.S. PATENT DOCUMENTS

| | | |
|---|---|---|
| 5,448,014 A | 9/1995 | Kong et al. |
| 5,578,974 A | 11/1996 | Yang et al. |
| 5,587,620 A | 12/1996 | Ruby et al. |
| 5,873,153 A | 2/1999 | Ruby et al. |
| 5,894,647 A | 4/1999 | Lakin |
| 6,060,818 A | 5/2000 | Ruby et al. |
| 6,150,703 A | 11/2000 | Cushman et al. |
| 6,262,637 B1 | 7/2001 | Bradley et al. |
| 6,278,342 B1 | 8/2001 | Ella |
| 6,424,237 B1 | 7/2002 | Ruby et al. |
| 6,693,500 B2 | 2/2004 | Yang et al. |
| 6,828,713 B2 | 12/2004 | Bradley et al. |
| 6,842,088 B2 | 1/2005 | Yamada et al. |
| 7,327,073 B2 | 2/2008 | Shearer et al. |
| 7,345,410 B2 | 3/2008 | Grannen et al. |
| 7,408,428 B2 | 8/2008 | Larson, III |
| 7,522,018 B2 | 4/2009 | Milsom et al. |
| 7,737,806 B2 | 6/2010 | Taniguchi et al. |
| 8,896,395 B2 | 11/2014 | Burak et al. |
| 9,197,185 B2 | 11/2015 | Zou et al. |
| 9,246,079 B2 | 1/2016 | Umeda et al. |
| 9,246,473 B2 | 1/2016 | Burak et al. |
| 9,374,059 B1 | 6/2016 | Hurwitz et al. |
| 9,401,692 B2 | 7/2016 | Burak |
| 9,479,139 B2 | 10/2016 | Ruby et al. |
| 9,634,643 B2 | 4/2017 | Shin et al. |
| 9,842,980 B2 | 12/2017 | Park et al. |
| 10,079,334 B2 | 9/2018 | Moulard et al. |
| 10,298,197 B2 | 5/2019 | Lee et al. |
| 10,601,391 B2 | 3/2020 | Stokes et al. |
| 11,736,088 B2 | 8/2023 | Stokes et al. |
| 11,764,750 B2 | 9/2023 | Hou et al. |
| 11,817,839 B2 | 11/2023 | Wang et al. |
| 11,909,373 B2 | 2/2024 | Wang et al. |
| 2005/0012568 A1 | 1/2005 | Aigner |
| 2005/0179508 A1 | 8/2005 | Sato |
| 2007/0001544 A1 | 1/2007 | Geefay |
| 2008/0111452 A1 | 5/2008 | Koizumi et al. |
| 2010/0019866 A1 | 1/2010 | Hara et al. |
| 2010/0148637 A1 | 6/2010 | Satou |
| 2011/0080233 A1 | 4/2011 | Petit et al. |
| 2011/0227671 A1 | 9/2011 | Zhang |
| 2011/0266917 A1 | 11/2011 | Metzger et al. |
| 2011/0298564 A1 | 12/2011 | Iwashita et al. |
| 2012/0205754 A1 | 8/2012 | Iwamoto |
| 2013/0049545 A1 | 2/2013 | Zou et al. |
| 2013/0057115 A1 | 3/2013 | Saito et al. |
| 2013/0140959 A1 | 6/2013 | Shin et al. |
| 2014/0125203 A1 | 5/2014 | Choy et al. |
| 2014/0354109 A1 | 12/2014 | Grannen et al. |
| 2016/0065171 A1 | 3/2016 | Ruby et al. |
| 2016/0294354 A1 | 10/2016 | Saijo et al. |
| 2016/0352309 A1 | 12/2016 | Xu et al. |
| 2017/0077385 A1 | 3/2017 | Stokes et al. |
| 2017/0149405 A1 | 5/2017 | Kishimoto |
| 2018/0138885 A1 | 5/2018 | Stokes et al. |
| 2019/0149129 A1 | 5/2019 | Ueda |
| 2019/0356293 A1 | 11/2019 | Kim et al. |
| 2019/0379344 A1 | 12/2019 | Wang et al. |
| 2020/0028482 A1 | 1/2020 | Hou et al. |
| 2020/0220520 A1 | 7/2020 | Stokes et al. |
| 2020/0235718 A1 | 7/2020 | Modarres-Zadeh et al. |
| 2020/0313648 A1 | 10/2020 | Wang et al. |
| 2020/0389150 A1 | 12/2020 | Wang et al. |
| 2021/0006220 A1 | 1/2021 | Schiek et al. |
| 2021/0099156 A1 | 4/2021 | Kirkendall et al. |
| 2021/0111693 A1 | 4/2021 | Hou et al. |
| 2021/0111701 A1 | 4/2021 | Hou et al. |
| 2021/0111702 A1 | 4/2021 | Wang et al. |
| 2021/0143792 A1 | 5/2021 | Pollard |
| 2021/0250012 A1 | 8/2021 | Hou et al. |
| 2022/0416149 A1 | 12/2022 | Hou et al. |

OTHER PUBLICATIONS

Global Communication Semiconductors, Inc., CN Office Action, Chinese Application No. 201711127532.1, dated Nov. 22, 2022, 23 pgs.
Global Communication Semiconductors, Inc., U.S. Non-Final Office Action, U.S. Appl. No. 17/071,831, dated Jul. 17, 2023, 12 pgs.
Global Communication Semiconductors, Inc., U.S. Non-Final Office Action, U.S. Appl. No. 16/455,627, dated Dec. 20, 2022, 8 pgs.
Global Communication Semiconductors, Inc., Restriction Election, U.S. Appl. No. 17/071,836, dated Jun. 21, 2023, 7 pgs.
Global Communication Semiconductors, Inc., U.S. Non-Final Office Action, U.S. Appl. No. 16/820,625, dated Nov. 14, 2022, 10 pgs.
Global Communication Semiconductors, Inc., U.S. Non-Final Office Action, U.S. Appl. No. 17/071,836, dated Aug. 1, 2023, 13 pgs.
Global Communication Semiconductors, Inc., U.S. Final Office Action, U.S. Appl. No. 17/002,498, dated Jun. 7, 2023, 16 pgs.
Global Communication Semiconductors, Inc., U.S. Notice of Allowance, U.S. Appl. No. 16/820,625, dated Apr. 5, 2023, 8 pgs.
Yoo et al., Spurious Resonances and Modelling of Composite Resonators, Department of Physics, The Catholic University of America, Washington, D.C., © 1983 IEEE, 3 pgs.
Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.
Working principles and Applications of SAW/FBAR Devices, Taiyo Yuden Navigator, Oct. 2017, 6 pgs.
Stokes, Notice of Allowance, U.S. Appl. No. 15/789,109, dated Nov. 14, 2019, 11pgs.
Wang, Office Action, U.S. Appl. No. 16/368,754, dated Jul. 13, 2022, 7pgs.
Wang, Office Action, U.S. Appl. No. 17/002,498, dated Jul. 12, 2022, 12pgs.
Global Communication Semiconductors, Inc., Restriction Election, U.S. Appl. No. 17/240,943, Apr. 10, 2024, 7 pgs.
Global Communication Semiconductors, Inc., U.S. Final Office Action, U.S. Appl. No. 17/071,836, Feb. 28, 2024, 17 pgs.
Global Communication Semiconductors, Inc., U.S. Notice of Allowance, U.S. Appl. No. 117/071,831, Jan. 5, 2024, 8 pgs.

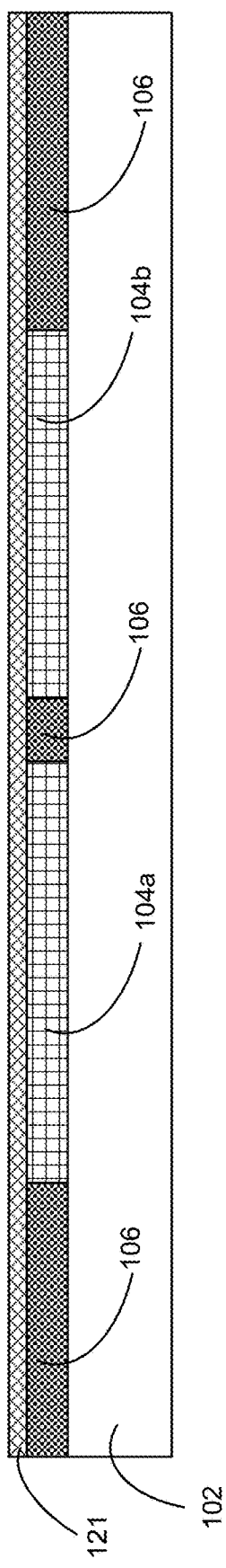
Figure 2D
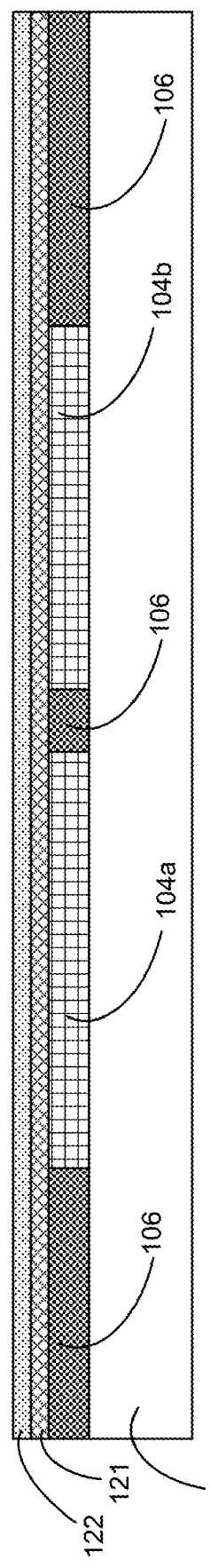
Figure 2E
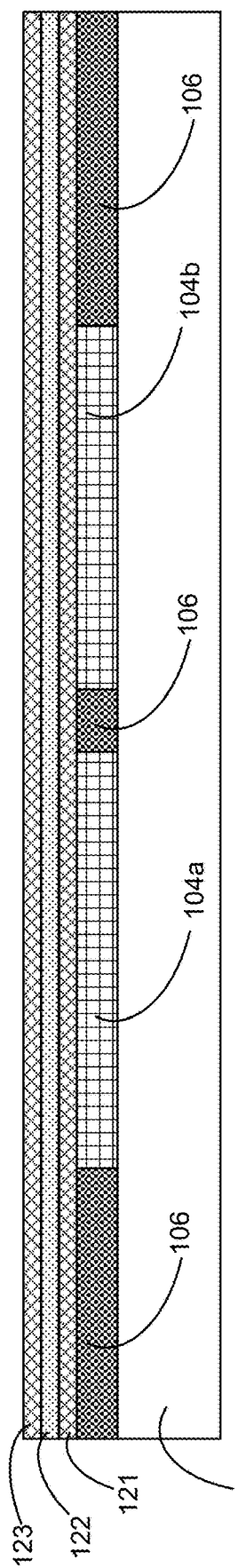
Figure 2F (Optional)

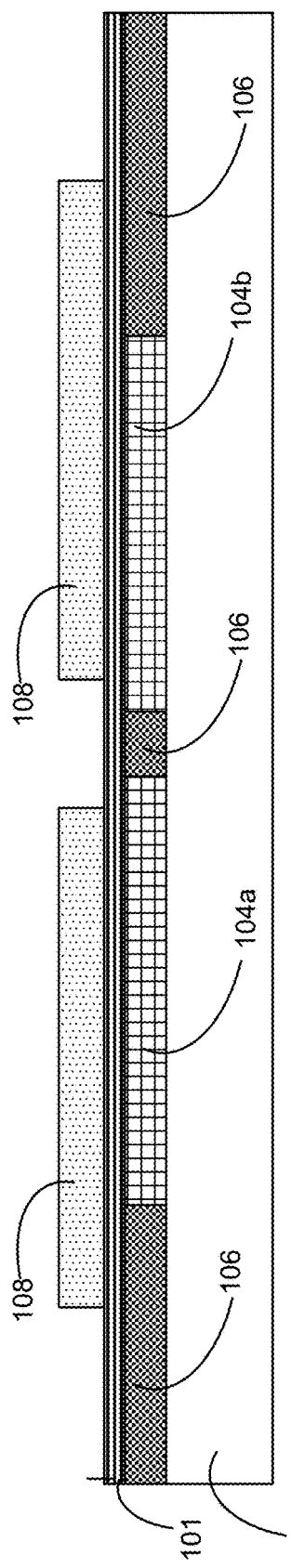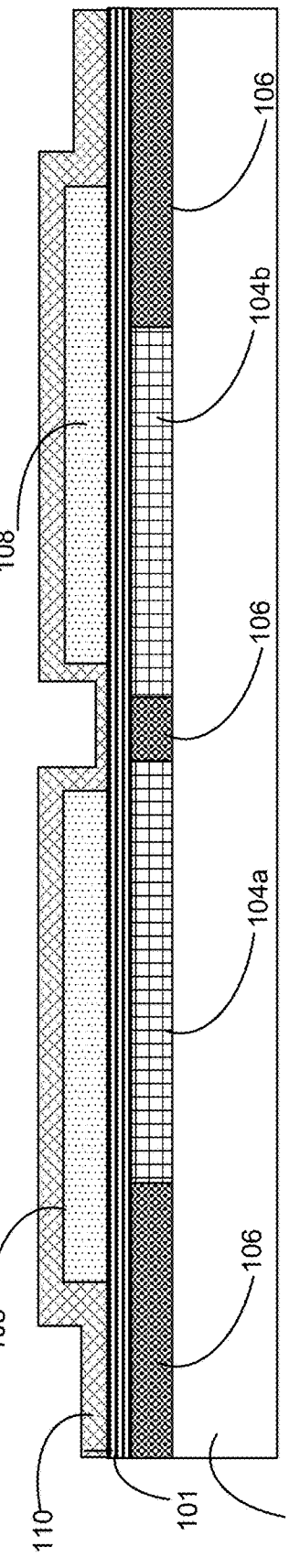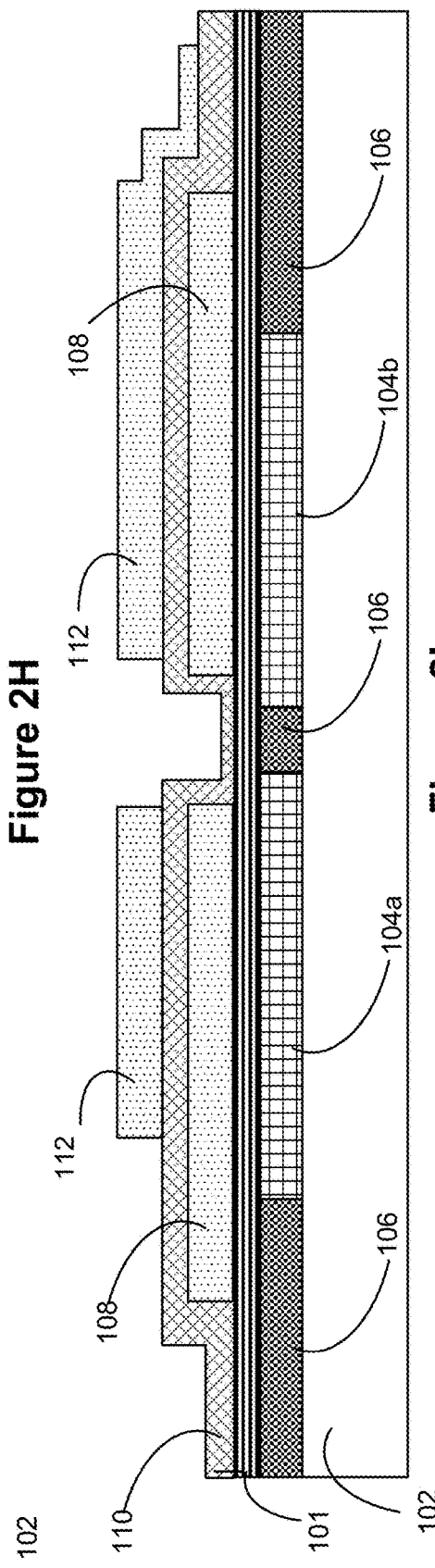

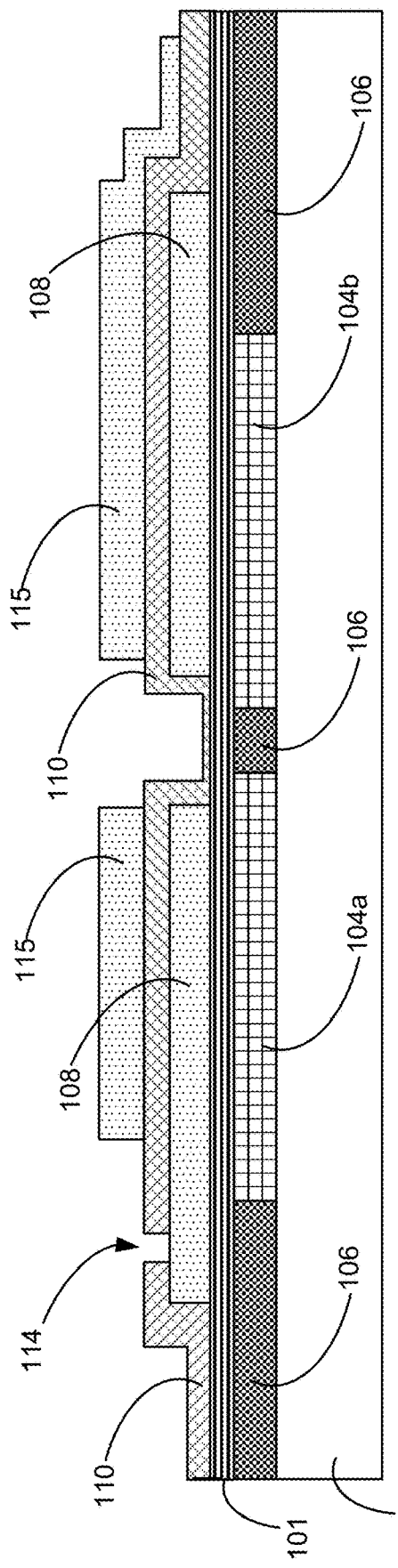
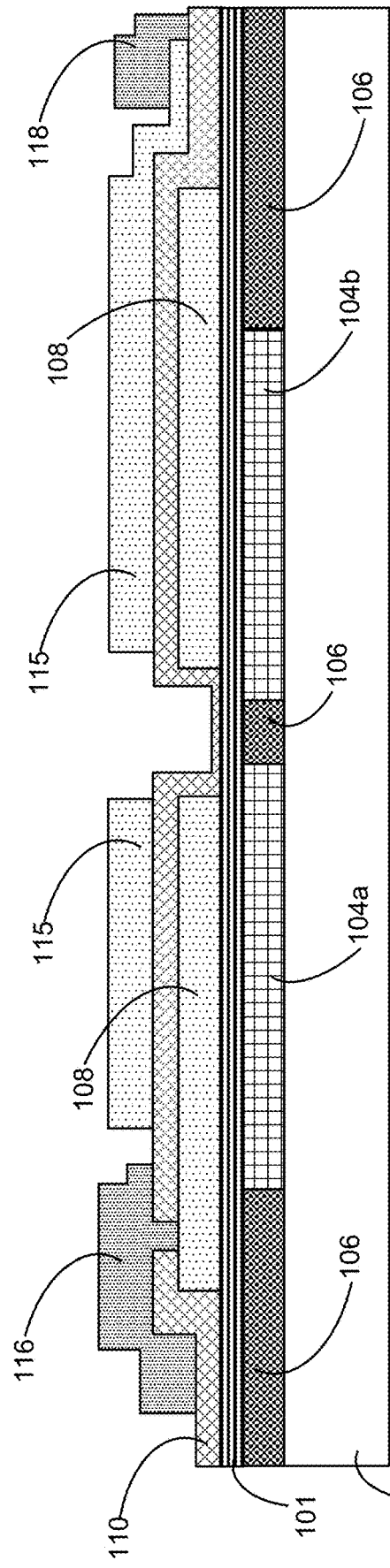
Figure 2J
Figure 2K

300

---

310 — forming, on a substrate having a layer of a sacrificial material and including a frame around the layer of sacrificial material, alternating layers of a first type of crystalline material having a first lattice constant and a second type of crystalline material having a second lattice constant that is distinct from the first lattice constant

312 — forming a first layer of crystalline material having the first lattice constant on the subtrate

314 — forming a second layer of crystalline material having the second lattice constant over the first layer

316 — forming a third layer of crystalline material having the first lattice constant, such that the second layer of crystalline material is disposed between the first layer of crystalline material and the third layer of crystalline material

↓

320 — forming one or more fourth layers of crystalline material distinct from each of the first layer, the second layer and the third layer of crystalline material

322 — the one or more fourth layers are interspersed among the first, second and third layers of crystalline materials

↓

330 — forming a BAW stack over the second layer of crystalline material, including:

332 — forming a first electrode formed on the second layer of crystalline material

334 — forming a piezoelectric layer having a first side coupled to the first electrode and a second side opposite to the first side

336 — forming a second electrode on the second side of the piezoelectric layer

Figure 3

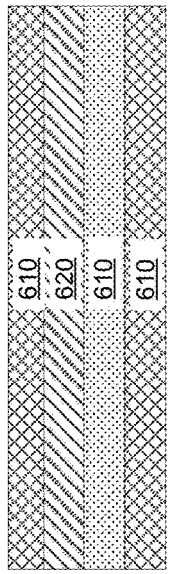
Figure 6D
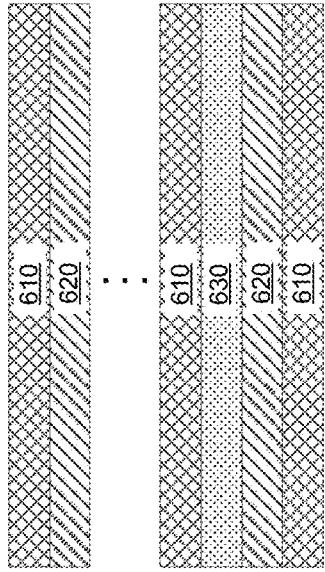
Figure 6E
Figure 6F
Figure 6A
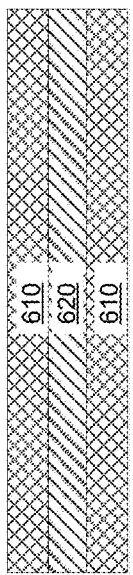
Figure 6B
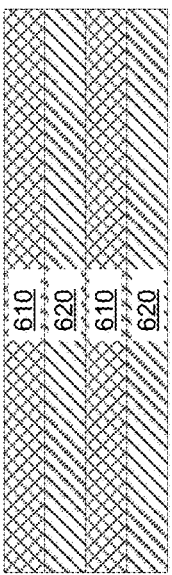
Figure 6C

BULK ACOUSTIC WAVE RESONATOR WITH MULTILAYER BASE

RELATED APPLICATIONS

This application claims priority to U.S. Provisional Patent Application No. 62/915,573, filed Oct. 15, 2019, U.S. Provisional Patent Application No. 62/915,577, filed Oct. 15, 2019, U.S. Provisional Patent Application No. 62/915,581, filed Oct. 15, 2019, and U.S. Provisional Patent Application No. 62/915,588, filed Oct. 15, 2019, each of which is hereby incorporated by reference in its entirety.

This application is related to U.S. patent application Ser. No. 17/071,831, filed Oct. 15, 2020, entitled "Composite Piezoelectric Film and Bulk Acoustic Resonator Incorporating Same," U.S. patent application Ser. No. 17/071,836, filed Oct. 15, 2020, entitled "Bulk Resonator with Symmetrically Positioned Temperature Compensation Layers," and U.S. patent application Ser. No. 17/071,849, filed Oct. 16, 2020, entitled "Bulk Acoustic Resonator Structures with Improved Edge Frames," each of which is hereby incorporated by reference in its entirety.

TECHNICAL FIELD

The disclosed embodiments relate generally to bulk acoustic resonators, and in particular, to a bulk acoustic resonator having a multilayer base.

BACKGROUND

A bulk acoustic wave (BAW) resonator (or BAWR) typically includes a piezoelectric thin film layer between a bottom electrode and a top electrode. When an oscillating electrical signal is applied between the top and bottom electrodes, the piezoelectric thin film layer converts the oscillating electrical signal into bulk acoustic waves. The resonance frequency of the BAW resonator is mainly determined by the thickness of the piezoelectric layer. Piezoelectric thin film materials used for bulk acoustic wave devices include AlN, ZnO thin films for small bandwidth applications and PZT films for wide bandwidth applications. BAW resonators are widely used in RF filters due to their compact size.

The performance of BAW resonators is largely determined by the quality, thickness, and acoustic property of the piezoelectric thin films, characterized by their electromechanical coupling factors or coefficients. Currently, the primary approach to making thin film resonators involves depositing thin layers of piezoelectric materials (e.g., AlN or ZnO) using techniques such as sputter deposition. The resulting thin films are usually polycrystalline and exhibit less than desired piezoelectric effects because of crystal growth in a variety of directions. Therefore, there is need to improve the quality of piezoelectric films in BAWRs.

SUMMARY

Accordingly, there is a need for BAW resonators with higher quality piezoelectric films and electrodes than what can be achieved by conventional fabrication methods.

In some embodiments, a bulk acoustic (BAW) resonator comprises a substrate having a cavity and including a frame surrounding the cavity, a multilayer base adjacent the cavity and supported by the frame, the multilayer base including at least a first layer of crystalline material having a first lattice constant and a second layer of crystalline material having a second lattice constant that is distinct from the first lattice constant. Further included in the BAW resonator is a BAW stack formed over the multilayer base. The BAW stack includes a first electrode formed on the multilayer base; a piezoelectric layer having a first side coupled to the first electrode and a second side opposite to the first side of the piezoelectric layer, and a second electrode coupled to the second side of the piezoelectric layer. The piezoelectric layer has improved alignment of crystal orientations due to the effectiveness of the multilayer base in relaxing the strains caused by the different lattice constants of different materials in the BAW stack.

In some embodiments, a process of fabricating a bulk acoustic resonator comprises the steps of forming a multilayer base on a substrate, the substrate including a layer of sacrificial material and a frame surrounding the layer of sacrificial material, wherein the multilayer base is formed over the layer of sacrificial material and the frame, and includes a first layer of crystalline material having a first lattice constant and a second layer of crystalline material having a second lattice constant that is distinct from the first lattice constant. The process further includes forming a stack over the multilayer base. The stack includes a first electrode formed on the multilayer base, a piezoelectric layer having a first side coupled to the first electrode and a second side opposite to the first side, and a second electrode coupled to the second side of the piezoelectric layer. In some embodiments, forming the multilayer base comprises forming the first layer over the sacrificial material and the frame, and forming the second layer over the first layer.

The successive layers of the base with different lattice constants helps to relax crystal lattice strains in subsequently formed crystalline layers, leading to an improved piezoelectric layer and a BAW resonator with higher performance.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 2A-2L illustrate cross-sectional views of a bulk acoustic resonator having a multilayer base during various stages of a fabrication process, in accordance with some embodiments.

FIG. 3 illustrates a flowchart representation of a process for forming a multilayer base, in accordance with some embodiments.

FIGS. 6A through 6F are cross-sectional diagrams of several examples of a multilayer base, in accordance with some embodiments.

Figure 1A:
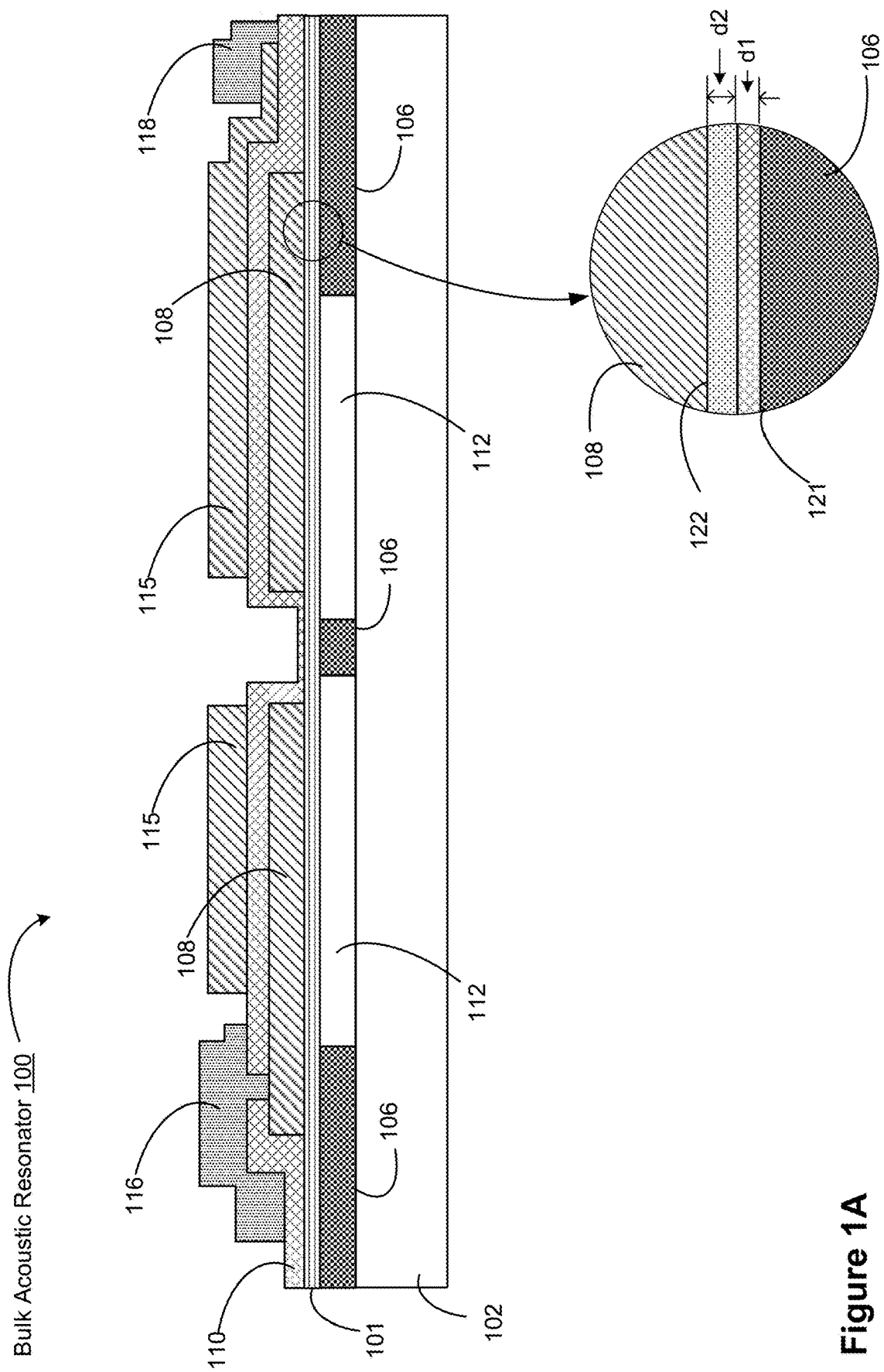
FIGS. 1A-1C are cross-sectional diagrams of a bulk acoustic resonator having a multilayer base, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to reduce resonance of spurious waves.

(A1) More specifically, some embodiments include a bulk acoustic resonator, the bulk resonator comprising a substrate having a cavity and including a frame around the cavity, a multilayer base adjacent the cavity and supported by the frame, the multilayer base including a first layer of crystalline material having a first lattice constant and a second layer of crystalline material having a second lattice constant that is distinct from the first lattice constant, and a stack over the multilayer base, the stack including: a first electrode formed on the multilayer base; a piezoelectric layer having a first side coupled to the first electrode and a second side opposite to the first side of the piezoelectric layer; and a second electrode coupled to the second side of the piezoelectric layer.

(A2) In some embodiments of the bulk acoustic resonator of A1, the multilayer base comprises a sequence of alternating layers of a first type of crystalline material and a second type of crystalline material. The first type of crystalline material has the first lattice constant and the second type of crystalline material has the second lattice constant, such that material composition in the multilayer base changes at least 10 times along a thickness thereof, and that a total thickness of the multilayer base is at least 10 times the thickness of any single layer of crystalline material in the multilayer base.

(A3) In some embodiments of the bulk acoustic resonator of A1, the multilayer base comprises a sequence of composition graded layers having gradually changing composition, and the sequence of composition graded layers comprises three of more successive layers, each having a composition of $A_xB_{1-x}C$, where A and B are chemically similar elements, C is an element complementary to A and B, and x is a composition fraction of A, a value of x monotonically increasing or decreasing in each successive layer in the sequence of composition graded layers (A4) In some embodiments of the bulk acoustic resonator of A1, the first layer includes a crystalline material selected from the group consisting of aluminum nitride (AlN), scandium aluminum nitride (ScAlN), Zinc Oxide (ZnO), or lead zirconate titanate (PZT), and the second layer includes a crystalline material selected from the group consisting of Molybdenum (Mo), Tungsten (W), scandium aluminum nitride ($Sc_xAl_{1-x}N$), and silicon dioxide ($SiO_2$)

(A5) In some embodiments of the bulk acoustic resonator of A1, the multilayer base further includes a third layer of crystalline material having the first lattice constant, and the second layer of crystalline material is disposed between the first layer of crystalline material and the third layer of crystalline material.

(A6) In some embodiments of the bulk acoustic resonator of A5, each of the first layer of crystalline material and the third layer of crystalline material includes aluminum nitride (AlN), and the second layer of crystalline material includes Molybdenum (Mo) or Tungsten (W), or scandium aluminum nitride ($Sc_xAl_{1-x}N$)

(A7) In some embodiments of the bulk acoustic resonator of A5, the multilayer base further includes a fourth layer of crystalline material distinct from any of the first layer of crystalline material, the second layer of crystalline material, and the third layer of crystalline material, and the fourth layer is disposed between the first layer of crystalline material and the third layer of crystalline material.

(A8) In some embodiments of the bulk acoustic resonator of A7, the first layer or the third layer has a first temperature coefficient of frequency, and at least one of the second layer and the fourth layer has a second temperature coefficient of frequency that is opposite in sign to the first temperature coefficient of frequency.

(A9) In some embodiments of the bulk acoustic resonator of A7 or A8, each of the first layer and the third layer includes aluminum nitride (AlN), the second layer includes Molybdenum (Mo), Tungsten (W), or scandium aluminum nitride ($Sc_xAl_{1-x}N$), and the fourth layer includes silicon dioxide ($SiO_2$).

(A10) In some embodiments of the bulk acoustic resonator of A1, the multilayer base further includes additional alternating layers of a first type of crystalline material and a second type of crystalline material. The first type of crystalline material has the first lattice constant and the second type of crystalline material has the second lattice constant.

(A11) In some embodiments of the bulk acoustic resonator of A1, each of the first layer of crystalline material and the second layer of crystalline material is 5 to 200 500 Angstroms in thickness.

(A12) In some embodiments of the bulk acoustic resonator of any of A1-A11, at least one of the first layer and the second layer includes a crystalline material that is the same as a crystalline material in the piezoelectric layer.

(A13) In some embodiments of the bulk acoustic resonator of any of A1-A12, each of the piezoelectric layer and the first layer of crystalline material includes aluminum nitride (AlN), scandium aluminum nitride (ScAlN), Zinc Oxide (ZnO), or lead zirconate titanate (PZT), and the second layer of crystalline material includes a material selected from the group consisting of Molybdenum (Mo), Tungsten (W), scandium aluminum nitride ($Sc_xAl_{1-x}N$), and silicon dioxide ($SiO_2$).

(A14) In some embodiments of the bulk acoustic resonator of any of A1-A13, each of the first layer of crystalline material, the second layer of crystalline material is 5 to 200 Angstroms in thickness.

(A15) In some embodiments of the bulk acoustic resonator of any of A1-A14, the piezoelectric layer comprises the same crystalline material as the second layer of crystalline material.

(A16) In some embodiments of the bulk acoustic resonator of any of A1-A15, the piezoelectric layer has an X-ray diffraction (XRD) peak profile with a full width at half maximum (FWHM) of less than 1.2 degrees.

(A17) In some embodiments of the bulk acoustic resonator of A16, the full width at half maximum (FWHM) is less than 1.1 degrees.

(A18) In some embodiments of the bulk acoustic resonator of A17, the full width at half maximum (FWHM) is about 1.07-1.08 degrees.

(A19) Some embodiments include a bulk acoustic resonator prepared by a process comprising the steps of: forming a multilayer base on a substrate, the substrate including a layer of sacrificial material and a frame surrounding the layer of sacrificial material, the multilayer base being formed over the layer of sacrificial material and the frame, and includes a first layer of crystalline material having a first lattice constant and a second layer of crystalline material having a second lattice constant that is distinct from the first lattice constant; forming a stack over the multilayer base, the stack including: a first electrode formed on the multilayer base; a piezoelectric layer having a first side coupled to the first electrode and a second side opposite to the first side; and a second electrode coupled to the second side of the piezoelectric layer; and removing the layer of sacrificial material to form a cavity adjacent the multilayer base.

(A20) In some embodiments of the bulk acoustic resonator of claim A19, forming the multilayer base on the substrate comprises forming the first layer over the sacrificial material and the frame, and forming the second layer over the first layer.

(A21) In some embodiments of the bulk acoustic resonator of A20, forming the multilayer base further comprises forming a third layer of crystalline material over the second layer, the third layer of crystalline material having the first lattice constant.

(A22) In some embodiments of the bulk acoustic resonator of A21, the multilayer base comprises alternating layers of at least two distinct types of materials, and forming the multilayer base on the substrate comprises: forming a fifth layer of crystalline material over the third layer of crystalline material, the fifth layer of crystalline material having the second lattice constant; and forming at least one sixth layer of crystalline material over the fifth layer of crystalline material, the at least one sixth layer of crystalline material including a material having the first lattice constant.

(A23) In some embodiments of the bulk acoustic resonator of any of A21-A22, forming the multilayer base further comprises, before forming the third layer, forming a fourth layer of crystalline material over the second layer, the fourth layer including a crystalline material that is distinct from the crystalline material in any of the first layer, the second layer and the third layer, the third layer being formed over the fourth layer.

(A24) In some embodiments of the bulk acoustic resonator of A23, the piezoelectric layer includes aluminum nitride (AlN), scandium aluminum nitride (ScAlN), Zinc Oxide (ZnO), and/or lead zirconate titanate (PZT), the first and third layer of crystalline material include aluminum nitride (AlN), scandium aluminum nitride (ScAlN), Zinc Oxide (ZnO), or lead zirconate titanate (PZT), the second layer of crystalline material includes Molybdenum (Mo) or Tungsten (W), and the fourth layer of crystalline material include scandium aluminum nitride ($Sc_xAl_{1-x}N$) or silicon dioxide ($SiO_2$).

(A25) In some embodiments of the bulk acoustic resonator of any of A19-A24, the piezoelectric layer includes aluminum nitride (AlN), scandium aluminum nitride (ScAlN), Zinc Oxide (ZnO), or lead zirconate titanate (PZT), and the first or second layer of crystalline material includes a material that is the same as the piezoelectric layer.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1A is a cross-sectional diagram of a bulk acoustic wave (BAW) resonator 100 including a multilayer base 101, in accordance with some embodiments. The multilayer base 101 is sometimes called or implemented as a superlattice base layer. Bulk acoustic resonator 100 includes a substrate 102, a multilayer base 101 formed over the substrate 102, and a BAW stack formed over the multilayer base 101. The substrate 102 has one or more cavities 112 (referred to individually and collectively hereinafter as cavity 112), and includes a frame 106 around the cavity 112. The multilayer base 101 is adjacent the cavity 112 and supported by the frame 106. The BAW stack includes a piezoelectric layer 110, a first electrode 108 coupled to a first side of a piezoelectric layer 110, and a second electrode 115 coupled to a second side of piezoelectric layer 110. In some embodiments, piezoelectric layer 110 includes aluminum nitride (AlN), scandium aluminum nitride (ScAlN), Zinc Oxide (ZnO), or lead zirconate titanate (PZT), or the like. Each of the first electrode 108 and the second electrode 115 includes molybdenum (Mo), tungsten (W) or scandium aluminum nitride ($Sc_xAl_{1-x}N$), or the like.

In some embodiments, the multilayer base 101 includes a first layer of crystalline material 121 having a first lattice constant, and a second layer of crystalline material 122 having a second lattice constant that is distinct from the first lattice constant. In some embodiments, the first layer 121 has a thickness d1 and includes a crystalline material, such as aluminum nitride (AlN), scandium aluminum nitride (ScAlN), Zinc Oxide (ZnO), or lead zirconate titanate (PZT). The second layer 122 has a thickness d2 and includes a crystalline material, such as Molybdenum (Mo), Tungsten (W), scandium aluminum nitride ($Sc_xAl_{1-x}N$), or silicon dioxide ($SiO_2$).

Figure 1B:
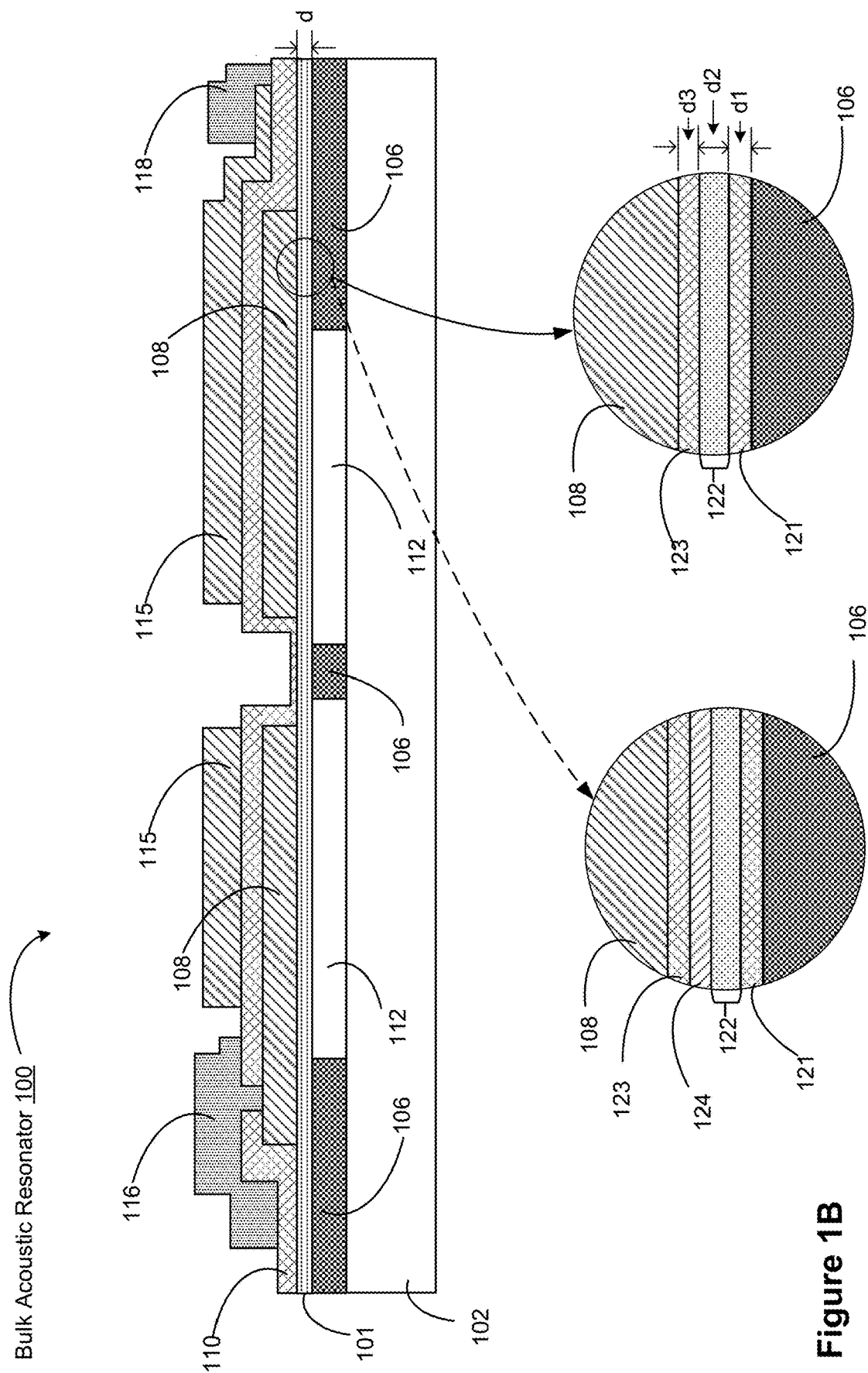

As shown in FIG. 1B, the multilayer base may further includes a third layer 123 of crystalline material having the first lattice constant, such that the second layer 122 of crystalline material is disposed between the first layer 121 of crystalline material and the third layer 123 of crystalline material. In some embodiments, the third layer 123 has a thickness d3 and includes a crystalline material, such as aluminum nitride (AlN), scandium aluminum nitride (ScAlN), Zinc Oxide (ZnO), or lead zirconate titanate (PZT). In some embodiments, the first lattice constant is the same or about the same as (e.g., having a value within 10% of the value of) a lattice constant of the piezoelectric layer 110. In some embodiments, the second lattice constant is the same or about the same as (e.g., having a value within 10% of the value of) a lattice constant of the first electrode 108.

In some embodiments, the multilayer base 101 includes alternating layers of at least two distinct types of crystalline materials, e.g., a first type of materials and a second type of materials, wherein each of the first type of materials has a lattice constant equal to or about equal to (e.g., having a value within 10 percent of) the first lattice constant, and wherein each of the second type of materials has a lattice constant distinct from the first lattice constant. In some embodiments, due to the alternating layer structure in multilayer base 101, material composition in the multilayer base 101 can change back and forth multiple times (e.g., 2, 3, 10, or even 100 times) between that of the first type of material and that of the second type of material. In some embodiments, a total thickness d of the multilayer base is at least 10 times the thickness (e.g., d1, d2, or d3) of any single layer of crystalline material in the multilayer base.

In some embodiments, the multilayer base 101 includes a sequence of composition graded layers having gradually changing composition. For example, in some embodiments, the sequence of composition graded layers includes three of more successive layers, each having a composition of $A_xB_{1-x}C$, where A and B are chemically similar elements and C is an element complementary to A and B, x is a composition fraction of A, and wherein a value of x monotonically increases or decreases in each successive layer in the sequence of composition graded layers. More specifically, in one particular example, the sequence of layers includes a sequence of five layers: 1) AlN (e.g., 100 angstroms), 2) $Sc_{0.05}Al_{0.95}N$ (e.g., 50 angstroms), 3) $Sc_{0.10}Al_{0.90}N$ (e.g., 50 angstroms), 4) $Sc_{0.15}Al_{0.85}N$ (e.g., 50 angstroms), and 5) $Sc_{0.20}Al_{0.90}N$ (e.g., 100 angstroms). Many other sequences of composition graded layers would be suitable in various embodiments of a BAW stack.

The multilayer base 101 according to some embodiments helps to relax crystal lattice strains caused by different crystal lattice constants of the different layers in the BAW stack and allows the piezoelectric layer 110 to be fabricated with improved quality. For example, crystal orientations of grain growth of the piezoelectric layer 110 deposited over the multilayer base 101 have improved alignment, resulting in the piezoelectric layer 110 having characteristics closer to those of a single crystal layer, as compared to a piezoelectric layer fabricated over a similar substrate 102 without the multilayer base 101. In some embodiments, each of the first layer of crystalline material 121 and the second layer of crystalline material 122 includes aluminum nitride (AlN), scandium aluminum nitride (ScAlN), Zinc Oxide (ZnO), or lead zirconate titanate (PZT), or the like. The at least one intermediate layer 123 includes molybdenum (Mo), tungsten (W), scandium aluminum nitride ($Sc_xAl_{1-x}N$), or the like. In some embodiments, each layer (e.g. first layer of crystalline material 121, second layer of crystalline material 122, and third layer 124A) in the multilayer base 101 is 5 to 200 Angstroms in thickness.

In some embodiments, piezoelectric layer 110 has a thickness of 1-2 micrometers. In some embodiments, lateral dimensions of the piezoelectric layer 110 is in the range of 0.1 to 1.0 micrometers. In some embodiments, the BAW resonator 100 further includes a cavity frame 106 under (or adjacent to) the multilayer base 101. The cavity frame 106, together with the piezoelectric layers 110, first electrode 108, and the substrate 102, forms a cavity 112 under (or adjacent to) the multilayer base 101. Cavity 112 provides a space between the substrate 110 and the piezoelectric layer 110 in which the BAW stack is free to resonate in response to electrical signals provided between the first electrode 108 and second electrode 115.

In some embodiments, a first contact 116 (e.g., aluminum) is formed at least partially within a contact hole in the piezoelectric layer 110 to be in contact with the first electrode 108. A second contact 118 is formed to be in contact with the second electrode 115. In this way, the BAW stack resonates in response to an electrical signal applied between the second electrode 115 and the first electrode 108 via the first contact 116 and the second contact 118, respectively.

BAW resonators typically oscillate at certain resonance frequencies with greater amplitude than at other frequencies. For example, a BAW resonator can be configured to generate bulk acoustic waves of a specific resonance frequency or to select a specific frequency from a signal. The resonance frequency of a BAW resonator can shift as an environment temperature changes, sometimes ranging −25~−30 ppm/° C., which phenomenon is characterized by a temperature coefficient of frequency (TCF). When a resonator has a large TCF value, the gap between adjacent bands is reduced and interference can occur, degrading the performance of the resonator.

Figure 1C:
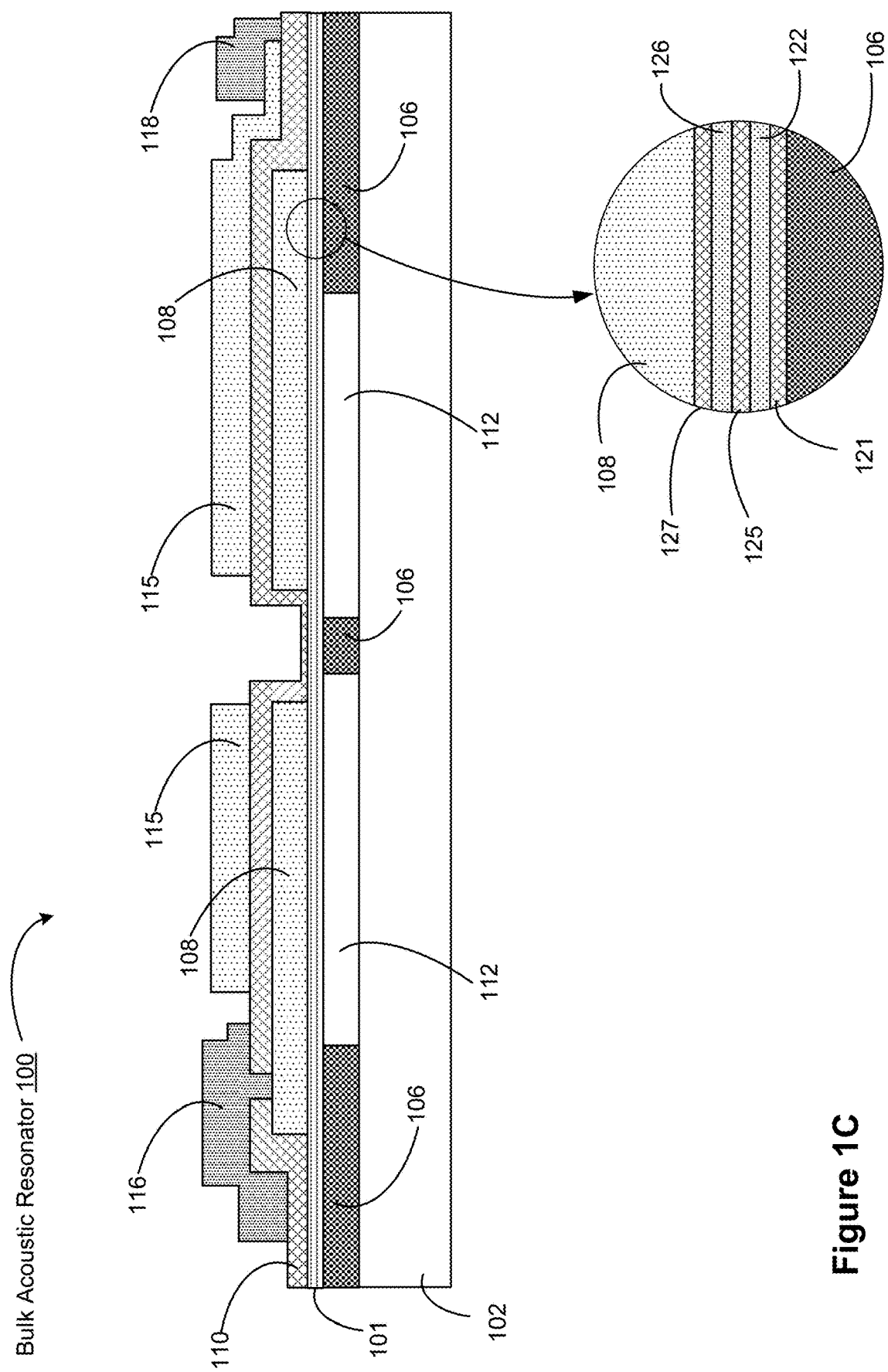

In some embodiments, as shown in FIG. 1B, to reduce the TCF of BAW resonator 100, the multilayer base 101 further includes a fourth layer 124 between the first layer of crystalline material 121 and the top layer of crystalline material (e.g., layer 123 or layer 127 shown in FIG. 1C). The fourth layer 124B comprises a crystalline material that is distinct from the crystalline material in any of the first layer 121, the second layer 122, and the third layer 123. In some embodiments, the fourth layer 124 has a TCF that offsets, or partially offsets, the TCF of the BAW stack. For example, in some embodiments, the BAW stack may include AlN in the piezoelectric layer 110, and a hard and heavy material such as tungsten (W) or molybdenum (Mo) in the first electrode layer 108 and the second electrode layer 115. These materials establish a moderately negative TCF for the BAW stack. To compensate for the negative TCF for the BAW stack, the fourth layer 124 includes silicon dioxide ($SiO_2$), which has a positive TCF. Stated another way, the multilayer base 101 includes a layer of material having a temperature coefficient of frequency that is opposite in sign to the temperature coefficient of frequency of the first and second layers of crystalline material 121 and 122. The thickness of the fourth layer 124 is selected based on the amount of TCF compensation desired for the BAW stack. In some embodiments, the fourth layer 124 of crystalline material in the multilayer base 101 is 5 to 200 Angstroms in thickness. In some embodiments, the multilayer base 101 may include multiple layers of one or more materials having a temperature coefficient of frequency that is opposite in sign to the temperature coefficient of frequency of the first and second layers of crystalline material 121 and 122, which are interspersed among alternating layers of two or more other types of crystalline materials.

In some embodiments, the multilayer layer 101 include other layers in addition to, the layers shown in FIG. 1A or 1B. In some embodiments, the multilayer base 101 include a plurality of repeating and alternating layers of two or more different materials. FIG. 1C is a cross-sectional diagram of a bulk acoustic resonator 100 having multilayer base 101, in accordance with some embodiments. Bulk acoustic resonator 100 includes a BAW stack and other structures similar to those described in FIG. 1A. FIG. 1C illustrates that the multilayer base 101 may include one or more additional layers, e.g., a fifth layer 125 of crystalline material, a sixth layer 126, and a seventh layer 127, in addition to the first layer 121 and the second layer 122. The fifth layer 125 may include a crystalline material that is the same as the crystalline material in the first layer 121, while the sixth layer 126 comprises a material distinct from the crystalline material in the first layer of crystalline material 121. In some embodiments, the sixth layer 126 comprises a material that is also in the second layer 122. In some embodiments, the sixth layer 126 comprises a material having a lattice constant distinct from the first lattice constant. The seventh layer 127 of crystalline material comprises a material distinct from the crystalline material in the at least one sixth layer 126. In some embodiments, the seventh layer 127 of crystalline material has the first lattice constant.

In some embodiments, the multilayer base 101 shown in FIG. 1C further comprises one or more layers (not shown) of crystalline material (e.g., molybdenum (Mo), tungsten (W) or scandium aluminum nitride ($Sc_xAl_{1-x}N$)) having a third lattice constant. The third lattice constant can be distinct from the second lattice constant or the same as the second lattice constant. In some embodiments, the multilayer base 101 shown in FIG. 1C further comprises another layer (not shown) of crystalline material (e.g., silicon dioxide ($SiO_2$)) having a TCF that offsets the TCF of the BAW stack, as described above with reference to FIG. 1B. In some embodiments, as shown in FIGS. 1A through 1C, the base layer 101 comprises alternating layers of two or more different materials. In some embodiments, the material composition of the multilayer base 101 alternates multiple times (e.g., 10-100 times) along its thickness dimension between layers of at least two distinct types of crystalline materials.

In some embodiments, each of layer of crystalline material of the multilayer base 101 is 5 to 200 Angstroms in thickness, and a total thickness d of the multilayer base is about 500 Angstroms in thickness.

FIGS. 2A-2L illustrate cross-sectional views of various layers in bulk acoustic resonator 100 during fabrication of the bulk acoustic resonator 100, in accordance with some embodiments.

Figure 2A:
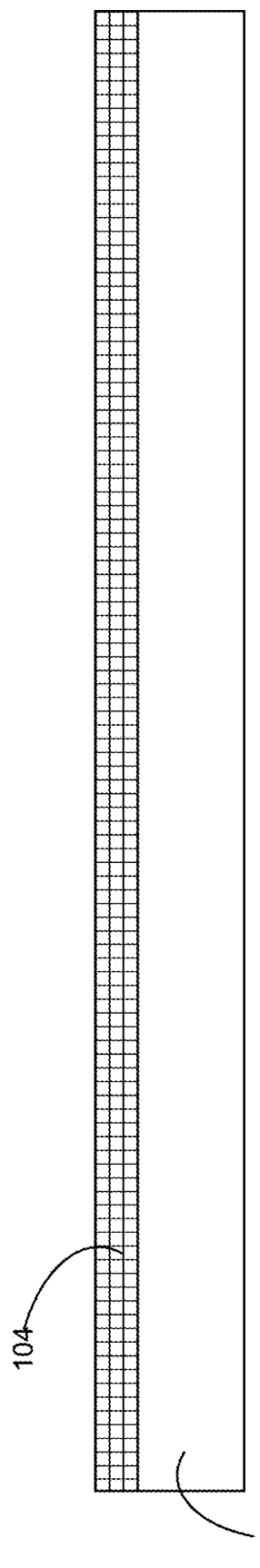

In FIG. 2A, a layer of sacrificial material 104 (e.g., silicon dioxide ($SiO_2$)), is formed on a substrate 102 (e.g., silicon, glass, ceramic, gallium arsenide and/or silicon carbide). For example, sacrificial material 104 can be formed by chemical vapor deposition on substrate 102 or by thermal oxidation of substrate 102.

Figure 2B:
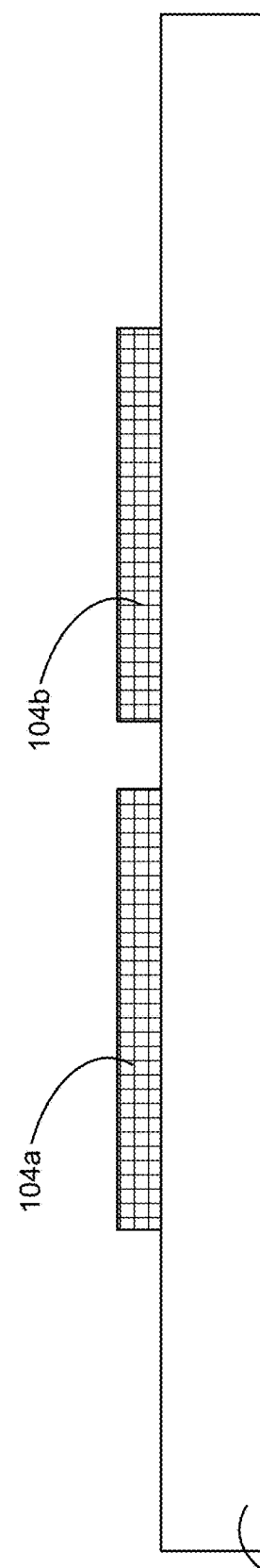

In FIG. 2B, sacrificial material 104 is selectively removed, such that portions 104a and 104b of sacrificial material 104 remain.

Figure 2C:
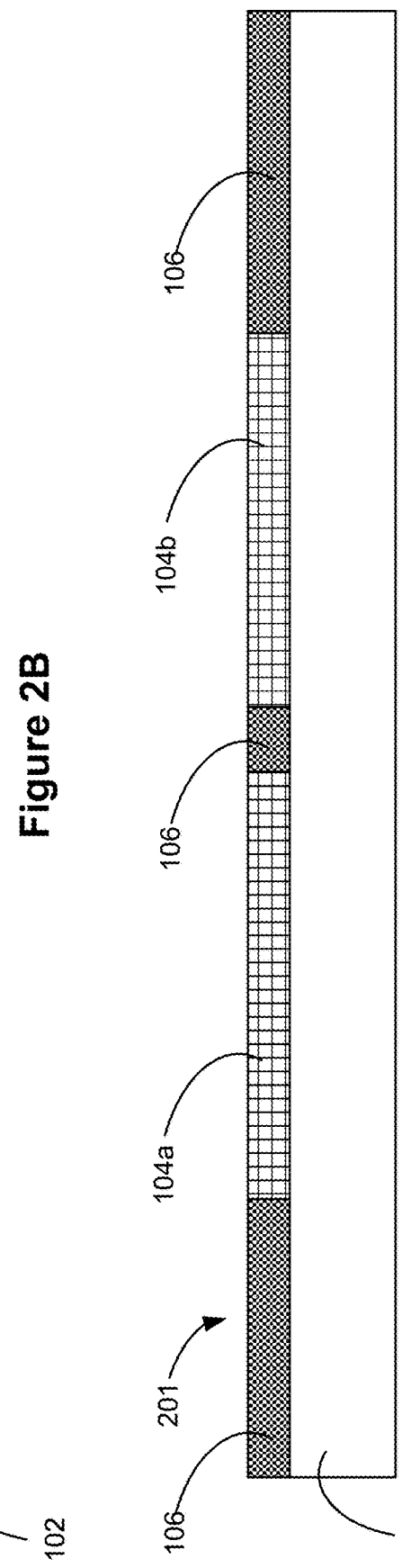

In FIG. 2C, a frame 106 (e.g., polysilicon, or aluminum oxide $AlO_3$) different from the sacrificial material, is formed on the substrate 102 (e.g., filling the spaces on substrate 102 created by removal of the sacrificial material 104, such as the spaces between and/or surrounding remaining sacrificial material 104a and 104b). In some embodiments, upper surface 201 (e.g., the upper surface of frame 106 together with upper surface of remaining sacrificial material 104a and 104b) is polished to obtain a flat surface.

In FIG. 2D, a first layer of crystalline material 121 (e.g., aluminum nitride (AlN), scandium aluminum nitride (ScAlN), Zinc Oxide (ZnO), or lead zirconate titanate (PZT)) is deposited over the frame 106 and the remaining sacrificial material 104. In some embodiments, the first layer of crystalline material 121, as described with regard to FIGS. 1A and 1B, is the same first layer of crystalline material 121 as described with regard to FIG. 2D.

In FIG. 2E, the second layer 122 of crystalline material (e.g. Molybdenum (Mo), Tungsten (W), $Sc_xAl_{1-x}N$, and/or SiO2) is deposited over the first layer of crystalline material 121.

In FIG. 2F, optionally a third layer of crystalline material 123 (e.g., aluminum nitride (AlN), scandium aluminum nitride (ScAlN), Zinc Oxide (ZnO), or lead zirconate titanate (PZT)) is deposited over the second layer 122. In some embodiments, the third layer 123 of crystalline material, as described with regard to FIG. 1B, is the same third layer 123 of crystalline material as described with regard to FIG. 2F.

In some embodiments, although not shown in FIGS. 2D-2F, forming the base layer 101 may further include depositing the fourth layer 124, before or after depositing the second layer 122, so that the forth layer 124 is between the first layer 121 and the third layer 123. In some embodiments, although not shown in FIGS. 2D-2F, forming the base layer 101 may further include depositing additional layers, such as the fifth layer 105, the sixth layer 106 and the seventh layer 107. In some embodiments, forming the base layer 101 includes alternately depositing layers of two or more distinct types of materials, so that the material composition in the multilayer base 101 changes multiple times (e.g., 10-100 times) along a thickness dimension thereof, and that a total thickness of the multilayer base is at least 10 times the thickness of any single layer of crystalline material in the multilayer base.

In some embodiments, some of the formation steps described above with reference to FIGS. 2D-2F are repeated until the various layers of the multilayer base 101 have been deposited.

In FIG. 2G, a first electrode 108 (e.g., molybdenum, aluminum, and/or tungsten) is formed over the multilayer base 101, as described in FIGS. 2D-2F, which is formed over frame 106 and/or the remaining sacrificial material 104a and 104b. In some embodiments, the first electrode 108, as described with regard to FIGS. 1A and 1B, is the same first electrode 108 formed as described with regard to FIG. 2G.

In FIG. 2H, a piezoelectric layer 110 (e.g., aluminum nitride and/or zinc oxide) is formed over the first electrode 108. In some embodiments, piezoelectric layer 110, as described with regard to FIGS. 1A and 1B, is the same piezoelectric layer 110 formed as described with regard to FIG. 2H.

In FIG. 2I, a second electrode 115 (e.g., molybdenum, aluminum, and/or tungsten) is formed over the piezoelectric layer 110. In some embodiments, second electrode 115, as described with regard to FIGS. 1A and 1B, is the same second electrode 115 formed as described with regard to FIG. 2I.

In FIG. 2J, material is selectively removed from piezoelectric layer 110 to form a contact hole or gap 114 by, for example, plasma etching. In some embodiments, material is selectively removed from piezoelectric layer 110 to form a contact hole or gap 114 after formation of the second electrode 115. In some embodiments, material is selectively removed from one or more of the second electrode 115, piezoelectric layer 110, and/or the first electrode 108 to form a channel (not shown), via which sacrificial material 104a and 104b is removed by, for example, wet chemical etching.

In FIG. 2K, a first contact 116 and a second contact 118 are formed. For example, first contact 116 (e.g., aluminum) is formed at least partially within contact access gap 114 to create an electrical contact with the first electrode 108. A second contact 118 is formed at least partially in contact with the second electrode 115.

Figure 2L:
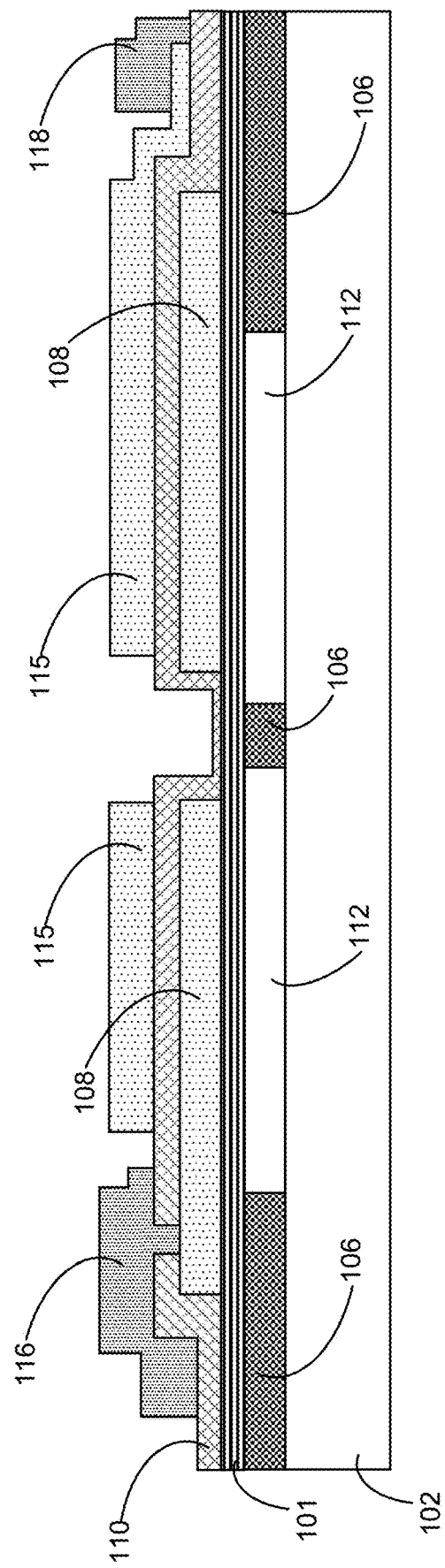

In FIG. 2L, a cavity 112 is formed by removing sacrificial material 104 (e.g., 104a and 104b as shown in FIG. 2J) from beneath the first electrode layer 108. For example, an etchant is applied via the channel (not shown) in the upper surface of the structure shown in FIG. 2J to etch away sacrificial material 104 and the etching products are flushed out of the structure also via the channel to form one or more cavities 112 as shown in FIG. 2L. In some embodiments, frame 106 that remains after sacrificial material 104 is removed becomes the cavity frame 106. In some embodiments, the structure shown in FIG. 2J (and/or a substrate 102 on which the structure shown in FIG. 2J is fabricated) is fabricated for removal of sacrificial material (e.g., by way of insertion and flushing of etchant) such that the cavity frame 106 is formed around the cavity 112.

FIG. 3 illustrates a flowchart representation of a process 300 for forming a BAW resonator with a multilayer base 101, in accordance with some embodiments. In some embodiments, the multilayer base 101 formed in accordance with process 300 includes at least a first crystalline layer having a first lattice constant and a second crystalline layer having a second lattice constant distinct from the first lattice constant, as described further below.

Process 300 for forming a BAW resonator with a multilayer base 101 involves various processing technologies such as, for example, oxidation, photo lithography, deposition, etching, liftoff patterning, and/or chemical mechanical planarization processes, etc., in appropriate sequences, as described below. While these sequences of operations, and the resulting BAW resonator with the multilayer base 101, are new, techniques well understood in the art can be used to perform individual steps or operations in these sequences. Therefore, some of the individual processing steps or operations are not described in detail. The dotted lines in processes 300 illustrate optional operations.

As shown in FIG. 3, process 300 includes forming (310) on a substrate 102 alternating layers of a first type of crystalline material having a first lattice constant and a second type of crystalline material having a second lattice constant that is distinct from the first lattice constant. In some embodiments, forming (310) the alternating layers includes forming (312) a first layer 121 of a crystalline material on substrate 102 (or on any structures previously formed on the substrate 102) and forming (314) a second layer 122 of crystalline material having the second lattice constant over the first layer 121. The first layer 121 of crystalline material (e.g., first layer of crystalline material 121, FIG. 2D) has the first lattice constant. In some embodiments, the first layer of crystalline material 121 includes aluminum nitride (AlN), scandium aluminum nitride (ScAlN), Zinc Oxide (ZnO), or lead zirconate titanate (PZT), etc. In some embodiments, the first layer of crystalline material 121 is formed on frame 106 and sacrificial material 104 (e.g., FIG. 2D) (e.g., polysilicon, aluminum, and/or silicon dioxide), for example, as described above with regard to FIG. 2D.

The second layer 122 includes at least one layer of material distinct from the first layer 121 of crystalline material. In some embodiments, the second layer 122 includes a layer of material selected from the group consisting of Molybdenum (Mo), Tungsten (W), scandium aluminum nitride ($Sc_xAl_{1-x}N$), and silicon dioxide ($SiO_2$).

In some embodiments, forming (310) the alternating layers includes forming (316) a third layer 123 of crystalline material having the first lattice constant, such that the second layer of crystalline material is disposed between the first layer of crystalline material and the third layer of crystalline material. In some embodiments, the third layer 123 of crystalline material includes aluminum nitride (AlN), scandium aluminum nitride (ScAlN), Zinc Oxide (ZnO), lead zirconate titanate (PZT), or the like.

In some embodiments, method 300 further includes forming (320) one or more fourth layers 124 of crystalline material distinct from any of the first layer 121, the second layer 122, and the third layer 123 of crystalline materials. In some embodiments, the one or more fourth layers 124 are interspersed among the alternating layers of the first and second types of crystalline materials. In some embodiments, the one or more fourth layers includes material having a TCF that offsets, or partially offsets, the negative TCF of the BAW stack. For example, to compensate for the negative TCF for the BAW stack, the one or more fourth layers 124 includes silicon dioxide (SiO2), which has a positive TCF.

In some embodiments, the alternating layers further includes a fifth layer of crystalline material (e.g., layer 125, as shown in FIG. 1C). In some embodiments, a sixth layer 126 of crystalline material, and a seventh layer 127 of crystalline material.

A second layer of crystalline material (e.g., second layer 122, as shown and described in any of FIGS. 1A, 1B, and 2F) is formed (320) over the at least one intermediate layer of material 123.

A bulk acoustic resonator stack is formed (330) over the second layer of crystalline material (e.g. the BAW stack as described and shown in any of FIGS. 1A, 1B, and 2G-2L.), including, for example, forming (332) a first electrode (e.g. first electrode 108, as shown and described in any of FIGS. 1A, 1B, and 2G-2L) over the second layer of crystalline material 122, forming (334) a piezoelectric layer (e.g., piezoelectric layer 110, as shown and described in any of FIGS. 1A, 1B, and 2H-2L) over the first electrode, and forming (336) a second electrode (e.g., second electrode 115, as shown and described in any of FIGS. 1A, 1B, and 2I-2L) over the piezoelectric layer. In some embodiments, the first electrode includes molybdenum, aluminum, and/or tungsten, the piezoelectric layer includes aluminum nitride (AlN), scandium aluminum nitride (ScAlN), Zinc Oxide (ZnO), lead zirconate titanate (PZT), or the like, and the second electrode includes molybdenum, aluminum, and/or tungsten.

While the above sequences of operations, and the resulting composite piezoelectric films and/or bulk acoustic resonators, are new, the techniques needed to perform each of the individual steps or operations of these processes are well understood in the art, and therefore the individual processing steps or operations are not described in detail.

Figure 4:
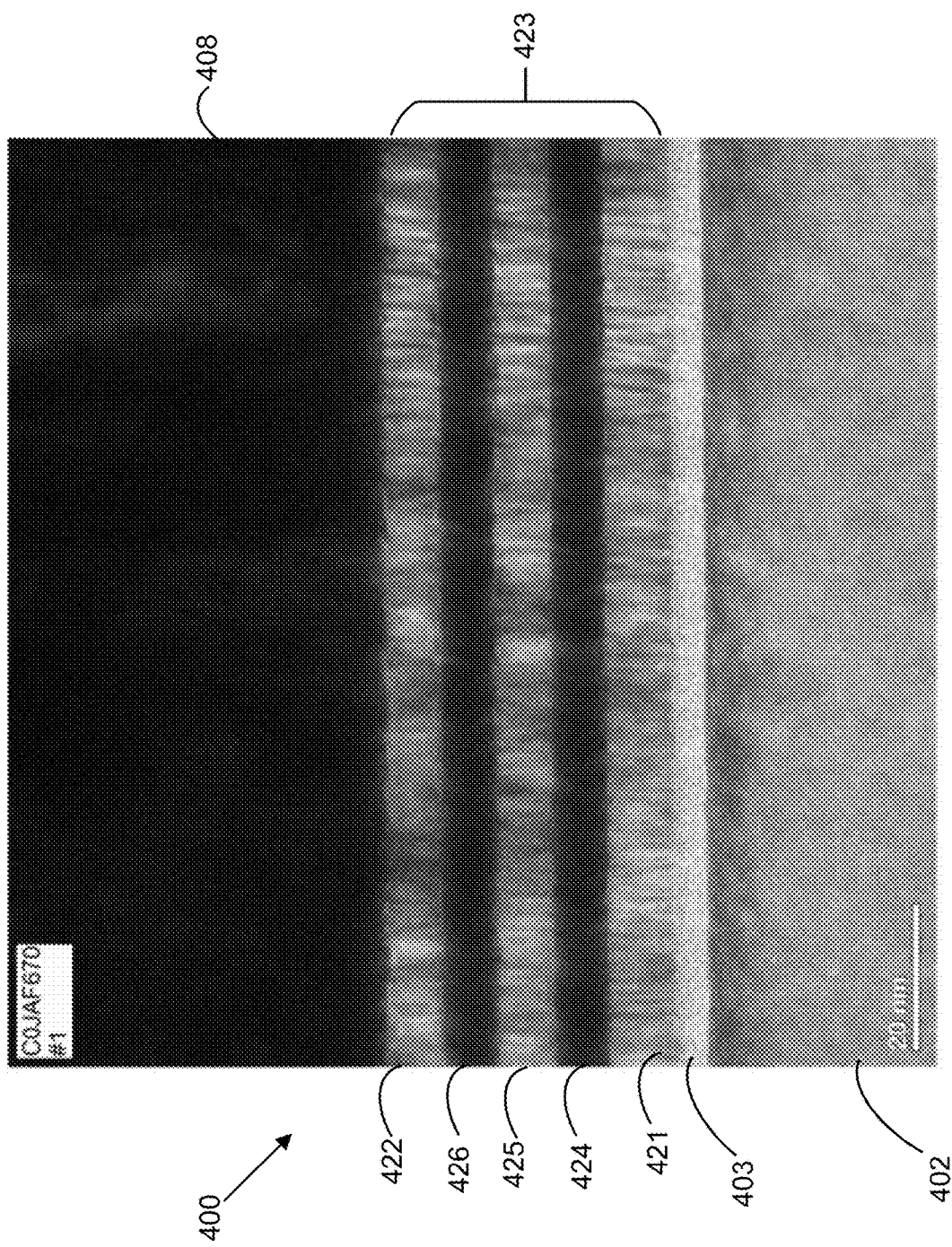
FIG. 4 is a transmission electron microscopy (TEM) image examining alignment of crystal orientations in a multilayer base, such as a superlattice base layer, in accordance with some embodiments.

FIG. 4 is a cross-sectional Transmission Electron Microscopy (TEM) image for examining crystal alignment of various layers in an exemplary multilayer base 400 between a silicon (Si) substrate 402 and an electrode layer 408. In this example, the multilayer base 400 includes alternating layers of two different materials (e.g., AlN and Mo). As shown in FIG. 4 the multilayer base 400 includes a first AlN layer 421 (corresponding to the first layer of crystalline material 121 in FIGS. 1A and 1B), a second layer AlN 422 (corresponding to the second layer of crystalline material 122 in FIGS. 1A and 1B), and a plurality of intermediate layers 423 (corresponding to the at least one intermediate layer 123 in FIGS. 1A and 1B). In this example, the plurality of intermediate layers 423 includes a first Mo layer 424 (corresponding to layer 124 in FIG. 1B), a second Mo layer 426 (corresponding to layer 126 in FIG. 1B), and a third AlN layer 425 (corresponding to layer 125 in FIG. 1B) between the first Mo layer 424 and the second Mo layer 126. FIG. 4 also shows native oxide 403 between the Si substrate 402 and the first AiN layer 421. In this example, each of the first AlN layer 421, the second AlN layer 422, the third AlN layer 425, the first Mo layer 424, and the second Mo Layer 426 is 5-20 nanometer (nm) in thickness.

As can be seen in the TEM image shown in FIG. 4, the repeated alternating structure of the multilayer base 400 is effective in aligning crystal orientations of grain growth of each subsequent layer, and relaxing strains due to different lattice constants of the different materials in the base layer 400. The crystals of the AlN layers 421, 425, and 422 in the multilayer base 400 grow in columns that are perpendicular to the plane of the layers, indicating effectiveness of the alternating AlN and Mo layers in relaxing the lattice strain and promoting better alignment of crystal orientations in the AlN layers. Thus, the unique multilayer base approach underneath the first electrode layer 408 according to some embodiments allows depositing high quality electrode materials (Mo, W) and piezoelectric materials (AN, ScAlN etc.) on a substrate (Si, SiO2, GaAs, SiC, etc.) for BAW resonator/filter fabrication.

Figure 5A:
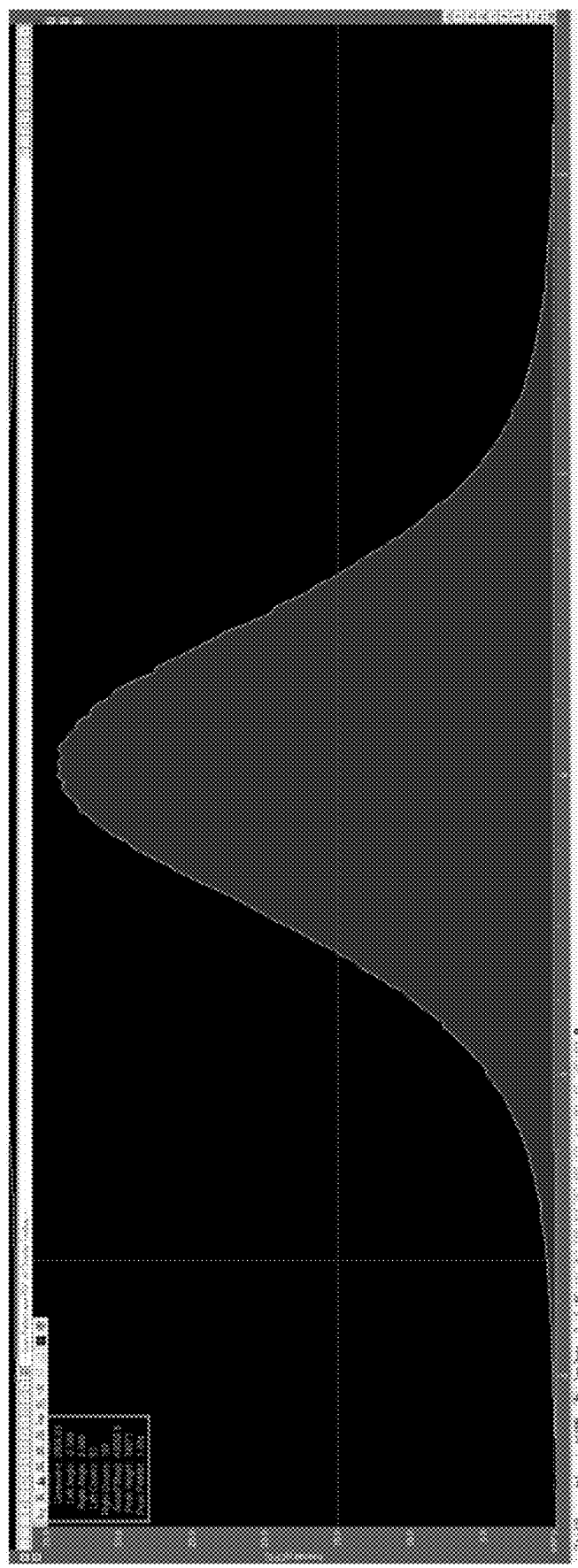
FIG. 5A is an X-ray diffraction (XRD) peak profile of a subsequently formed AlN crystalline layer over the multilayer base, in accordance with some embodiments.
Figure 5B:
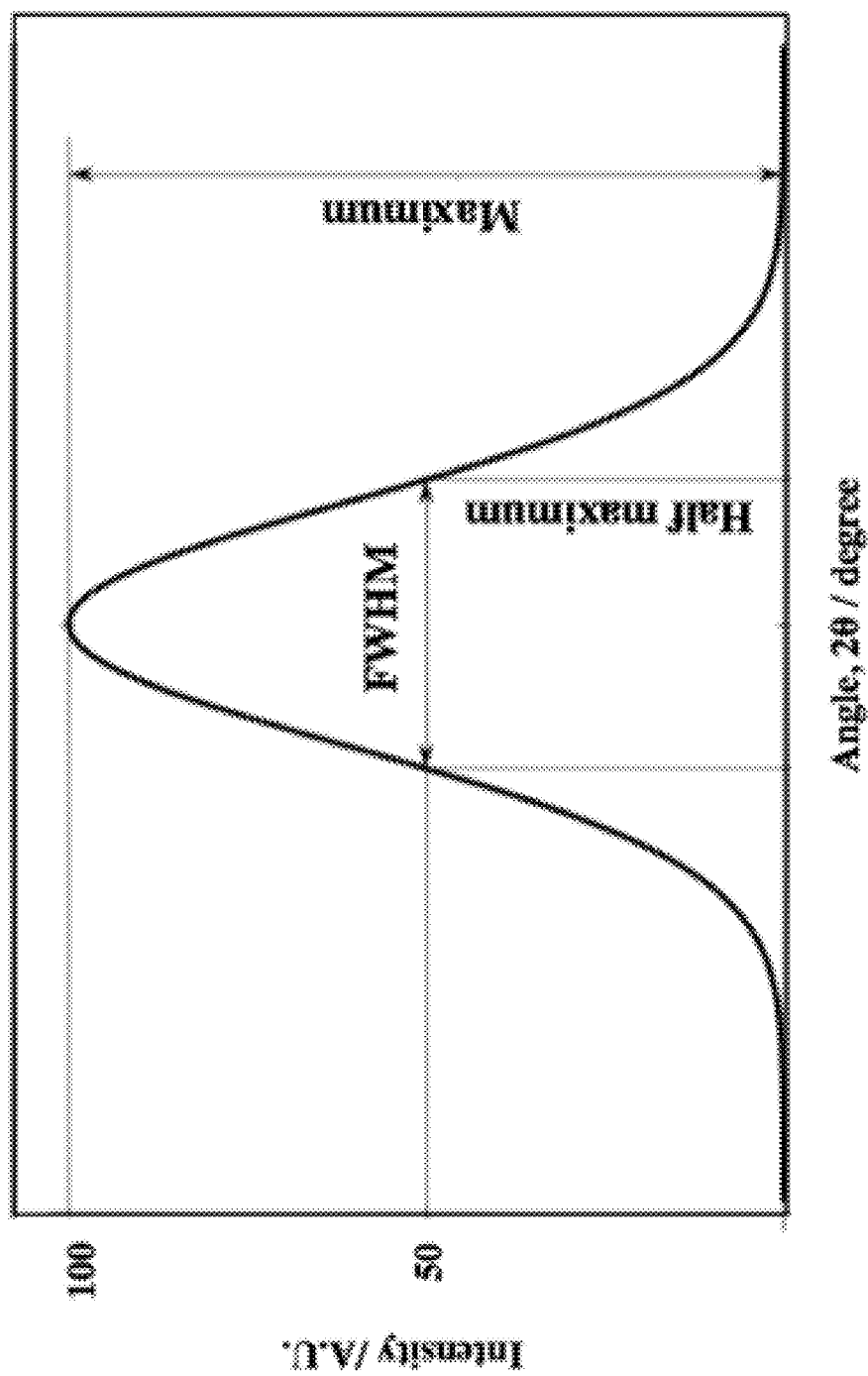
FIG. 5B is a plot illustrating full width at half maximum (FWHM) in an X-ray diffraction (XRD) peak profile.

FIG. 5A is an X-ray diffraction (XRD) peak profile of an AlN piezoelectric layer formed over the multilayer base 400 shown in FIG. 4. The X-Ray diffraction (XRD) technique is widely used in research and development and industry for material characterization and process control, as it can provide detailed information about lattice parameters of single crystals, and phase, texture or even stress of polycrystalline materials. The quality of the AlN piezoelectric layer can be quantified by measuring the full width at half maximum (FWHM) of the XRD profile, as illustrated in FIG. 5B. FWHM is known to be sensitive to the variation in microstructure and stress-strain accumulation in the material. As shown in FIG. 5A, the full-width at half maximum (FWHM) of the XRD peak profile for the AlN piezoelectric layer formed over the multilayer base 400 is about 1.07-1.08 degrees, which is significantly smaller than the FWHM of 1.24-1.25 degrees for a comparison AlN piezoelectric layer formed over a seed AlN layer on the same type of substrate. Thus, FIG. 4 demonstrates the effectiveness of the multilayer base 400 in enhancing the quality of the subsequently formed AlN piezoelectric layer.

FIGS. 6A through 6F are cross-sectional diagrams of a few examples of a multilayer base 601, 602, 603, 604, 605, and 606 that can be fabricated using the processes described above. Each multilayer base 601, 602, 603, 604, 605, and 606 can be used as the multilayer base 101 in BAW resonator 100 shown in FIG. 1A or 1B, according to some embodiments.

The examples of multilayer bases 601, 602, and 603, shown in FIGS. 6A, 6B, and 6C, respectively, each comprises alternating layers of a first material 610 (e.g., aluminum nitride (AlN), scandium aluminum nitride (ScAlN), Zinc Oxide (ZnO), or lead zirconate titanate (PZT), etc.) having a first lattice constant, and a second material 620 (e.g., Molybdenum (Mo), Tungsten (W), scandium aluminum nitride ($Sc_xAl_{1-x}N$), or silicon dioxide (Sift)), having a second lattice constant, according to some embodiments. The second lattice constant is different from the first lattice constant. Lattice constant matching is important for the formation of thin layers of materials on other materials. When the lattice constants differ, strains are introduced into each subsequently formed layer. In certain embodiments, a first layer of the first material 610 at the bottom of the multilayer base 601, 602, or 603 is first formed by, for example, sputter deposition over a substrate (e.g., substrate 102 or any structure on the substrate). The first layer of the first material 610 serves as a seed layer for subsequently deposited layers. The alternating structure of the multilayer base 601, 602, or 603 helps to relax the lattice strain caused by the different lattice constants of the two different materials, leading to the subsequent formation of a smoother, more uniform first electrode layer 108, which in turn, facilitates the formation of a higher quality piezoelectric layer 110 on the first electrode layer 108. As a result, piezoelectric coupling of BAW resonator 100 using the multilayer base 601, 602, or 603 as the multilayer base 101 is significantly improved. The improved piezoelectric coupling allows for wider bandwidth electrical filters to be built with the resonator 100 and also yields more reproducible results.

FIGS. 6D and 6E show examples, 604 and 605, of multilayer bases, respectively, which serve as examples of incorporating one or more layers of a third material 630 (e.g., silicon dioxide) into multilayer base 601, according to some embodiments. As discussed above, the third material 630 has a TCF that is opposite to, or which has a sign that is the opposite of the sign of, the TCF of the BAW stack to be formed over the multilayer base, so as to reduce the TCF of the BAW resonator 100 that uses the multilayer base 604 or 605 as the multilayer base 101. FIG. 6F shows multilayer base 606, which serves as an example of incorporating one or more layers of a third material 630 (e.g., silicon dioxide) into multilayer base 602, according to some embodiments. In some embodiments, each layer of material in multilayer base 601, 602, 603, 604, 605, or 606 is 5 to 200 Angstroms in thickness. The multilayer base 101 can have other configurations and can include other layers or sequences of layers not shown in FIGS. 6A-6F in addition to, or in place of, the layers shown in FIGS. 6A-6F.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:
1. A bulk acoustic resonator, comprising:
   a substrate having a cavity;
   a frame around the cavity;
   a multilayer base adjacent the cavity and supported by the frame, the multilayer base including at least a first layer of crystalline material having a first lattice constant and a second layer of crystalline material having a second lattice constant that is distinct from the first lattice constant; and
   a stack over the multilayer base, the stack including:
      a first electrode formed on the multilayer base;

a piezoelectric layer having a first side coupled to the first electrode and a second side opposite to the first side; and a second electrode coupled to the second side of the piezoelectric layer.

2. The bulk acoustic resonator of claim 1, wherein the multilayer base comprises a sequence of alternating layers of at least two distinct crystalline materials such that material composition in the multilayer base changes at least 10 times along a thickness thereof and that a total thickness of the multilayer base is at least 10 times the thickness of any single layer of crystalline material in the multilayer base.

3. The bulk acoustic resonator of claim 1, wherein the multilayer base comprises a sequence of composition graded layers having gradually changing composition, and wherein the sequence of composition graded layers comprises three or more successive layers, each having a composition of $A_xB_{1-x}C$, where A and B are chemically similar elements, C is an element complementary to A and B, and x is a composition fraction of A, and wherein a value of x monotonically increases or decreases in each successive layer in the sequence of composition graded layers.

4. The bulk acoustic resonator of claim 1, wherein the first layer includes a crystalline material selected from the group consisting of aluminum nitride (AlN), scandium aluminum nitride (SLAIN), Zinc Oxide (ZnO), and lead zirconate titanate (PZT), and wherein the second layer includes a crystalline material selected from the group consisting of Molybdenum (Mo), Tungsten (W), scandium aluminum nitride ($Sc_xAl_{1-x}N$), and silicon dioxide ($SiO_2$).

5. The bulk acoustic resonator of claim 1, wherein the multilayer base further includes a third layer of crystalline material having the first lattice constant, and wherein the second layer of crystalline material is disposed between the first layer of crystalline material and the third layer of crystalline material.

6. The bulk acoustic resonator of claim 5, wherein each of the first layer of crystalline material and the third layer of crystalline material includes aluminum nitride (AlN), and wherein the second layer of crystalline material includes Molybdenum (Mo) Tungsten (W), or scandium aluminum nitride ($Sc_xAl_{1-x}N$).

7. The bulk acoustic resonator of claim 5, wherein the multilayer base further includes a fourth layer of crystalline material distinct from any of the first layer of crystalline material, the second layer of crystalline material, and the third layer of crystalline material, wherein the fourth layer is disposed between the first layer of crystalline material and the third layer of crystalline material.

8. The bulk acoustic resonator of claim 7, wherein the first layer of crystalline material or the third layer of crystalline material has a first temperature coefficient of frequency, and wherein at least one of the second layer of crystalline material and the fourth layer of crystalline material has a second temperature coefficient of frequency that is opposite in sign to the first temperature coefficient of frequency.

9. The bulk acoustic resonator of claim 7, wherein each of the first layer of crystalline material and the third layer of crystalline material includes aluminum nitride (AlN), and wherein the second layer includes Molybdenum (Mo), Tungsten (W), or scandium aluminum nitride ($Sc_xAl_{1-x}N$), and the fourth layer includes silicon dioxide ($SiO_2$).

10. The bulk acoustic resonator of claim 1, wherein the multilayer base further includes additional alternating layers of a first crystalline material and a second crystalline material, wherein the first crystalline material has the first lattice constant and the second crystalline material has the second lattice constant.

11. The bulk acoustic resonator of claim 1, wherein each of the first layer of crystalline material and the second layer of crystalline material is 5 to 500 Angstroms in thickness.

12. The bulk acoustic resonator of claim 1, wherein at least one of the first layer and the second layer includes a crystalline material that is the same as a crystalline material in the piezoelectric layer.

13. The bulk acoustic resonator of claim 12, wherein the piezoelectric layer includes one or more materials selected from the group consisting of aluminum nitride (AlN), scandium aluminum nitride (ScAlN), Zinc Oxide (ZnO), and lead zirconate titanate (PZT), the first layer of crystalline material includes aluminum nitride (AlN), scandium aluminum nitride (ScAlN), Zinc Oxide (ZnO), or lead zirconate titanate (PZT), and the second layer of crystalline material includes a material selected from the group consisting of Molybdenum (Mo), Tungsten (W), scandium aluminum nitride ($Sc_xAl_{1-x}N$), and silicon dioxide ($SiO_2$).

* * * * *